United States Patent [19]

Burnham

[11] 4,447,904
[45] May 8, 1984

[54] SEMICONDUCTOR DEVICES WITH NONPLANAR CHARACTERISTICS PRODUCED IN CHEMICAL VAPOR DEPOSITION

[75] Inventor: Robert D. Burnham, Los Altos Hills, Calif.

[73] Assignee: Xerox Corporation, Stamford, Conn.

[21] Appl. No.: 446,893

[22] Filed: Dec. 6, 1982

Related U.S. Application Data

[62] Division of Ser. No. 231,556, Feb. 4, 1981.

[51] Int. Cl.³ .............................................. H01S 3/19
[52] U.S. Cl. ...................................... 372/45; 357/17; 372/46; 427/87
[58] Field of Search ............... 372/44, 45, 46; 357/17, 357/60; 427/87; 148/174, 175

[56] References Cited

U.S. PATENT DOCUMENTS

| 3,978,428 | 8/1976 | Burnham et al. | 372/45 |
| 4,053,350 | 10/1977 | Olsen et al. | 427/87 |
| 4,249,142 | 2/1981 | Burnham et al. | 372/45 |
| 4,251,298 | 2/1981 | Thompson | 148/171 |
| 4,256,816 | 3/1981 | Dunkleberger | 430/11 |
| 4,335,461 | 6/1982 | Streifer et al. | 372/45 |
| 4,371,966 | 2/1983 | Scifres et al. | 372/45 |

FOREIGN PATENT DOCUMENTS

| 2041439 | 3/1971 | Fed. Rep. of Germany | 357/60 |
| 53-78177 | 7/1978 | Japan | 357/60 |
| 1533645 | 11/1978 | United Kingdom . | |

OTHER PUBLICATIONS

Samid et al., "Embedded Heterostructure Epitaxy: A Technique for Two Dimensional Thin-Film Definition", *APL* vol. 27, No. 7, Oct. 1, 1975, pp. 405-407.
Dupuis et al.–"Preparation & Properties of $Ga_{1-x}Al_x$-As-GaAs Heterostructure Lasers Grown by Mo-CVD", IEEE J. of QE, QE-15(3), pp. 128-135.
Dupuis–"$Ga_{1-x}Al_x$As-GaAs Heterostructure Lasers Grown by Mo-CVD", Jap. J. of A.P., vol. 19, Supp. 19-1, pp. 415-423, 1980.
Mori et al.–"V-DH Laser: A Laser with a V-Shaped . . . by Mo-CVD"–Electronic Letters, vol. 16(20), pp. 785-787, 9/80.

*Primary Examiner*—James W. Davie
*Attorney, Agent, or Firm*—W. Douglas Carothers, Jr.

[57] ABSTRACT

Semiconductor devices, e.g., semiconductor injection lasers, are fabricated via chemical vapor deposition having one or more layers of semiconductor material of predetermined lateral spatial thickness variation or tapered contour and are formed by means of pyrolyzation of vapor mixtures of semiconductor materials deposited as a layer or layers through an aperture of a mask employed during deposition thereof.

37 Claims, 41 Drawing Figures

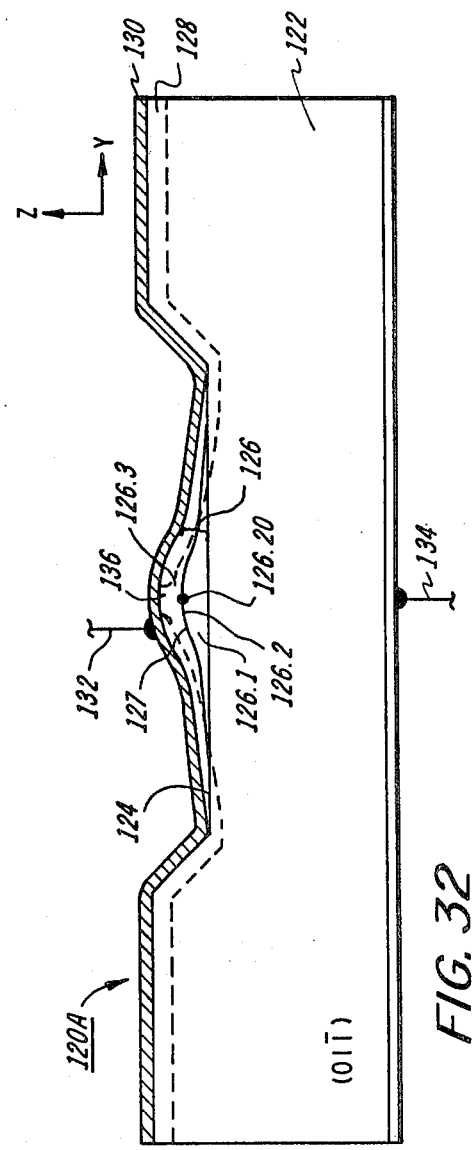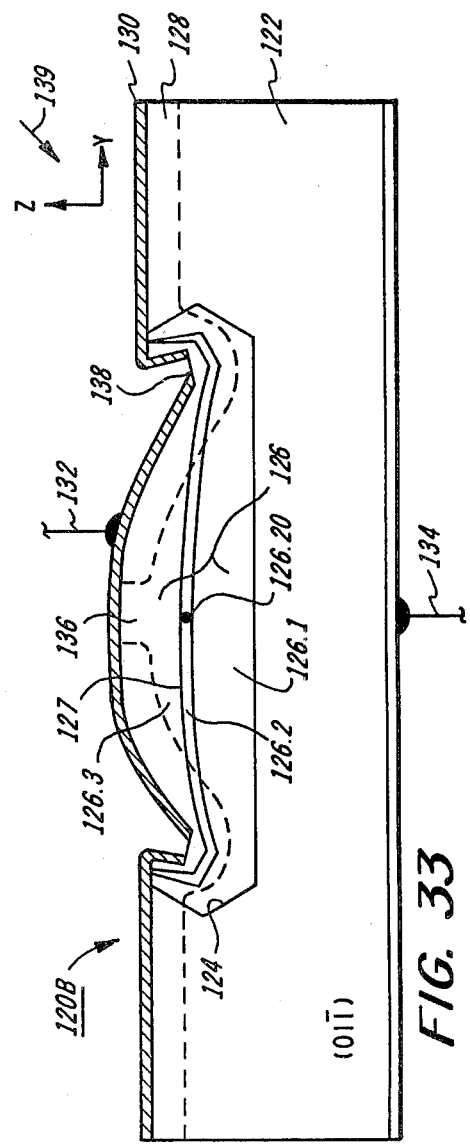

ns with curved
SEMICONDUCTOR DEVICES WITH NONPLANAR CHARACTERISTICS PRODUCED IN CHEMICAL VAPOR DEPOSITION This is a division, of application Ser. No. 231,556, filed Feb. 4, 1981.

BACKGROUND OF THE INVENTION

This invention relates to semiconductor devices fabricated via chemical vapor deposition and, in particular, the fabrication of such devices in metalorganic chemical vapor deposition (MO-CVD) with nonplanar layer characteristics by means of masking techniques employed during growth.

It has been established in research and development of semiconductor injection lasers having an active layer and/or cladding layers which are nonplanar and have spatial variation in their thickness exhibit improved properties, such as, low threshold current, linear light output verses current characteristics an stable fundamental transverse mode control. Such nonplanar variations are discussed in U.S. Pat. No. 4,335,461 entitled "Injection Lasers With Lateral Spatial Thickness Variations (LSTV) In The Active Layer" and assigned to the assignee herein and in corporated herein by reference thereto.

To date, such nonplanar lasers have been successfully grown by liquid phase epitaxy (LPE).

Within the past several years, molecular beam epitaxy (MBE) and metalorganic chemical vapor deposition (MO-CVD) have become important processes in the fabrication of single crystal semiconductor integrated devices, including injection lasers. MBE is a growth process carried out under ultra high vacuum conditions, by the evaporation of the crystal constituents and dopants and beam deposited on substrates. MO-CVD is a gaseous crystal growth technique in which compounds, such as, $(CH_3)_3 Ga$, are caused to react with other gases, such as, $AsH_3$, and appropriate dopants, in the vapor phase to produce single crystalline or polycrystalline deposits. These two procedures have, to a large extent, replaced the conventional LPE crystal growth techniques, owing to their improved control over (1) layer thickness, (2) crystal composition, (3) layer smoothness, (4) abruptness of interfaces, and (5) uniform doping profiles.

LPE processes permit nonplanar variations in layer contours and thicknesses as desired. For example, LPE growth of channeled substrate lasers produced curved contours and thickness variations in deposited layers on the substrate. However, MBE and MO-CVD processes characteristically do not produce the same type of growth variations. Depending upon deposit rate, flow rate, substrate temperature, etc., the deposited layers or films tend to "match" the contour and shape of the depositing surface. It would be desirable to start with a substrate surface with a curved contour having a curved contour or taper adequate to produce the tapered variations during growth, as taught in the previously mentioned patent application. However, it is not readily easy to fabricate the desired curvature in a substrate prior to growth. It would be simpler to develop the desired contour during growth, as done in the past, and obtain better accuracy and control in the desired contour and thickness variations that MBE and MO-CVD processes would provide.

One way of accomplishing these spatial variations in MBE is by employing a mask having an aperture. The mask is positioned between the elemental sources and the substrate. Only elemental materials propagating through the mask aperture will deposit on the surface of the substrate.

But what about masking in MO-CVD processes? One would conclude that an apertured mask in MO-CVD will be of little help. MO-CVD involves the flow of gases through a reactor that engage a supported substrate where pyrolyzation of vapor mixtures of elemental compounds in these gases occurs. Turbulance is present in the flow of these gases in the region of the substrate. One would, therefore, postulate that because of the turbulant nature of the gas flow in this region, it would be inept for one to conclude that apertured masking may be a viable way of producing desired layer spatial variations during MO-CVD growth processes. With an apertured mask positioned over the substrate upon which deposition is to occur, the turbulant motion of gases about and in the mask aperture would surely lead to uneven and nonuniform spatial variations in tapered contours and layer or film thicknesses.

SUMMARY OF THE INVENTION

According to this invention, a semiconductor device may be fabricated via chemical vapor deposition to have one or more layers of predetermined lateral spatial thickness variation. The lateral spatial thickness variation may be formed by means of pyrolyzation of vapor mixtures of semiconductor materials comprising the layer or layers through an aperture of a mask employed during the chemical vapor deposition thereof.

A particular example of such a semiconductor device is a semiconductor injection laser device which is fabricated by metal organic chemical vapor deposition (MO-CVD) with the aid of an apertured mask wherein the active layer and possibly other layers comprising the laser device are deposited in the MO-CVD reactor through a mask aperture onto a laser substrate so that the layers so deposited are characterized by a lateral spatial thickness variation or tapered contour wherein the thickest region of the variation is central of the mask aperture.

The mask structure may be removable and removed after deposition of such layers or may be an integral part of device structure, i.e., an integral layer with an aperture formed therein.

The mask may be a removable mask, positioned over the structure, e.g., semiconductor injection laser, upon which deposition is to occur, either in spaced relation to the depositing surface or in engagement with that surface. The mask may be an integral mask comprising a deposited layer of the structure or formed in the structure, such as, formed in a semiconductor substrate. Whether of the removable or of the integral type, variations in the mask aperture dimensions and the spacing relative to the structure surface upon which deposition is to occur can provide accurate control of the desired spatial variations in deposited layers or films.

Integral masks have the advantage over removable masks of being fabricated of thinner mask dimensions (in the low μm range). Micro-semiconductor structures are possible having micro spatial variations. However, the dimensions of composite removable mask structure can approach the small dimensions of the integral mask.

Spacing of removable masks from the depositing surface may be accomplished by supporting the mask in spaced relation from the depositing surface. In the case of integral masking, a well or channel may be formed in the structure through the aperture of the mask. This is advantageous in the fabrication of semiconductor injection lasers because not only can the one or more layers (e.g. the active layer) of the completed device have desired spatial variations but also current confinement definition and alignment are automatically achieved during growth in a congruent manner, which was not previously possible in any other process.

The masking techniques disclosed may be used in the deposition of amphorous, polycrystalline or single crystalline materials and layers.

Other objects and attainments together with a fuller understanding of the invention will become apparent and appreciated by referring to the following description and claims taken in conjunction with the accompanying drawings.

BRIEF DESCRIPTION OF THE DRAWINGS

FIG. 11 is a side elevation of a channeled semiconductor structure comprising a substrate with an integral mask;

FIG. 18 is a side elevation of a semiconductor structure similar to FIG. 17 but without a channel formed in the substrate;

FIG. 19 is a side elevation of a semiconductor structure with a mask having a cavity similar to mask shown in FIG. 4;

FIG. 20 is a side elevation of a semiconductor structure with a flat surface mask similar to mask shown in FIG. 3:

FIG. 21 is a side elevation of a semiconductor structure having a mask similar to the mask of FIG. 20 except having an outwardly beveled mask aperture;

FIG. 22 is a side elevation of a semiconductor structure having a mask similar to the mask of FIG. 20 except having an inwardly beveled mask aperture;

FIG. 23 is a side elevation of a semiconductor structure similar to FIG. 22 but having a mask with an inwardly beveled mask aperture and a mask cavity similar to the mask cavity shown in mask of FIG. 19;

FIG. 24 is a side elevation of a semiconductor structure similar to FIG. 23 except provided with a deeper mask cavity;

FIG. 25 is a side elevation of a semiconductor structure having a mask aperture similar to the mask aperture in FIG. 21 and provided with a mask cavity;

FIG. 26 is a side elevation of a semiconductor structure with a composite mask structure;

FIG. 27 is a side elevation of a channeled semiconductor structure having a flat mask structure like the mask shown in FIG. 20;

FIG. 28 is a side elevation of a channeled semiconductor structure with a central mesa disposed in the structure channel and a mask structure like the mask shown in FIG. 19;

FIG. 29 is a side elevation of a channeled semiconductor structure similar to the mask shown in FIG. 28 except having an upwardly disposed mask cavity;

FIG. 30 is a side elevation of a channeled semiconductor structure with a pair of pointed shaped mesas centrally disposed in the structure channel and a mask structure like the mask shown in FIG. 20;

FIG. 31 is a side elevation of a channeled V-shaped semiconductor structure employing a mask structure like the mask disclosed in FIG. 28:

FIG. 32 is a diagrammatic illustration of a double heterostructure injection laser with a nonplanar active region having desired spatial variations, grown in a channeled substrate with a removable mask employed during deposition;

FIG. 33 is a diagrammatic illustration of another double heterostructure injection laser with a nonplanar active region having desired spatial variations, grown in a channeled substrate with a removable mask employed deposition;

DETAILED DESCRIPTION OF THE PREFERRED EMBODIMENTS

Figure 1:
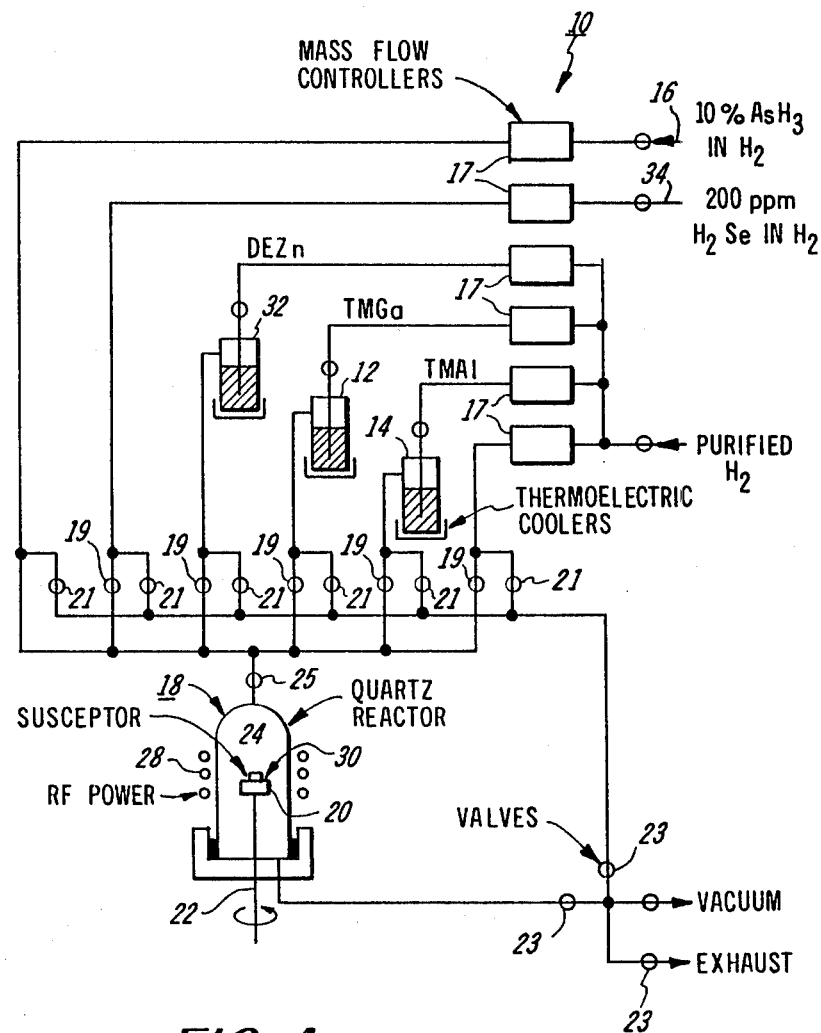
FIG. 1 is a schematic representation of a MO-CVD reactor system suitable for practicing the method according to this invention.

In FIG. 1 there is shown a conventional MO-CVD reactor system 10 for practicing this invention and for the fabrication of semiconductor devices, such as, injection lasers. The employment of the mask configurations and making techniques to be dissued are not limited to MO-CVD. These masks may be readily employed in other chemical vapor deposition systems and in molecular beam epitaxy (MBE). In the case of MBE, however, the desired degree of spatial variations may not be as easily achieved.

System 10 will be described in conjunction with elemental compounds used in fabrication of GaAs/GaAlAs injection lasers. However, employing the masking techniques to disclosed, any other depositable materials may be used.

Prior art discussion of MO-CVD systems is found in an article of Russell D. Dupuis and P. Daniel Dapkus entitled "Preparation & Properties of $Ga_{1-x}Al_xAs$-GaAs Heterostructure Lasers Grown by Metalorganic Chemical Vapor Deposition", *IEEE Journal of Quantum Electronics,* Vol. QE-15, No. 3, pp. 128–135, March, 1979.

System 10 comprises sources 12, 14 and 16, respectively, trimethylgallium ($TMG_a$), trimethylaluminum (TMAl), and arsenic hydride ($AsH_3$). Sources 12 and 14 are bubbler sources with purified hydrogen provided from source 15. The hydrogen is bubbled through these sources at a controlled rate via the mass flow controllers 17. Physical vapor phase mixtures of these compounds are pyrolyzed in hydrogen generally between 600° to 850° C. to form thin solid films according to the net reaction:

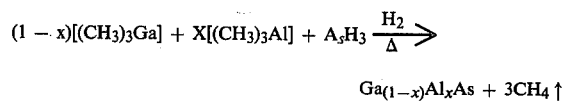

$$Ga_{(1-x)}Al_xAs + 3CH_4 \uparrow$$

The metalorganics TMGa, TMAl and DEZn are liquids near room temperature with relatively high vapor pressures. Hydrogen gas from source 15 is used as a carrier to transport these source vapors into vertical reactor 18. Susceptor 20 is supported within the reactor on a rotable rod 22. The semiconductor structure 24 upon which deposition is to occur, is positioned on the top of susceptor 20. The terms "semiconductor structure" as used herein means a semiconductor substrate or one or more previously deposited semiconductor layers on a semiconductor substrate.

The RF heating coil 28 provides heat to the deposition zone 30, surrounding susceptor 20 and structure 24, to within the above mentioned temperature range to pyrolyze the vapor phase mixtures of the source compounds. The alloy composition of the deposited film is controlled by the relative partial pressures of the Ga and Al metalorganic source compounds.

For p-type zinc doping a source 32 of diethylzinc (DEZn) is employed and for n-type Se doping a source 34 of hydrogen selenide ($H_2Se$) is employed.

The flows of metalorganics and hydrides are precisely controlled to desired molecular proportions for introduction into the reactor 18 by means of the mass flow controllers 17. The growth rates are typically from 1,000–10,000 A per minute. The thickness of layers and the extent of doping can be precisely controlled by the appropriate timed sequencing of the path flow values 19. Exhaust flow valves 23 are used in purging the system 10.

Briefly, the process for forming layers on a structure 24 comprises the steps of (1) evacuating the reactor 18; (2) flushing the reactor 18 with hydrogen; (3) heating the deposition zone 30 to the desired deposition temperature within the range of 600° C. to 850° C.; (4) equilibrating the flow gas from the compound sources by connecting the appropriate sources to exhaust while also bubbling hydrogen through selected metalorganic sources 12, 14 or 32 at a controlled rate to equilibrate the vapor flows at desired ratios; (5) introducing the selected reactants into the reactor 18 for a given period of time to form a thin film or layer of desired thickness on the exposed surface of the structure 24; and (6) thereafter exhausting all reactant gases from the reactor 18 and cooling the structure while purging the reactor with hydrogen.

The reactant gases enter the reactor 18 via main flow valve 25 and spread throughout the physical volume of reactor. Unlike MBE, the environment comprises a vapor phase mixture of reactant materials that will pyrogenically react in zone 30. There being the physical movement of gases in and about the area of the susceptor 20 and the semiconductor structure 24, there are also some divergent gas flow created in this region. Uniform and unobstructed growths are, thus, possible on the structure surface.

Recently there have been developments in the semiconductor field of designing and fabricating semiconductor devices with strip or bounded composites or mesa type buried structures. These structures are formed via additional and intermediate processing steps which usually invoke selective etching. An example of such a device is an injection laser disclosed in U.S. Pat. No. 4,371,966 entitled "Heterostructure Lasers With Combination Active Strip And Passive Waveguide Strip" and assigned to the assignee herein. Masking techniques would be desirable to form these mesa type patterns or layers directly by deposition to eliminate intermediate steps of removal of the growth structure from the process and apply selective etch techniques to form the desired strip or mesa type structures.

Crude forms of masking have been employed in LPE for growing desired patterns directly on substrates through mask patterns but with limited success. Masking techniques have been also employed in MBE with a good degree of success because growth takes place in an ultra high vacuum chamber and the beams of elemental constituents are, for the most part, unidirectional. In MO-CVD, however, the reactant gases entering the reactor are multi-directional. Attempts to employ apertured masks in a potentially turbulant environment is highly suspect of not producing uniform and desirably contoured deposited patterns via mask apertures. I have discovered, to the contrary, that apertured masks may be employed in MO-CVD to form mesa type patterns through mask apertures having desired spatial variations in pattern contour and thickness. These spatial variations are accomplished by several factors: (1) mask size; (2) dimensional size of the mask aperture; (3) the thickness of the mask and mask aperture; and (4) spacing relative to the surface below the mask aperture upon which deposition is to occur. Mask structures may be either of the removable or integral type. If of the integral type, their presence provides for "automatic" fulfillment of alignment for location and fabrication of current confinement means for semiconductor devices, such as, injection lasers.

From my development of mask parameters and structures as well as masking techniques in MO-CVD, I have found that the non-directional aspect of the reactant gases may, indeed, not be as paramount as one might believe. Although it is not all together clear why masking during growth is successful in MO-CVD, it appears reasonable that one reason for success is that when the gas components, such as, $H_2$ and $CH_3$, dissociate from the liberated elements or compounds deposited, they are comparatively of much lighter mass and because of the thermal dissociation, have attained high kinetic energy. Because of these two factors, they move at much higher velocities than other molecular components and are able to move expeditiously away from the mask aperture and the deposition zone.

Figure 2:
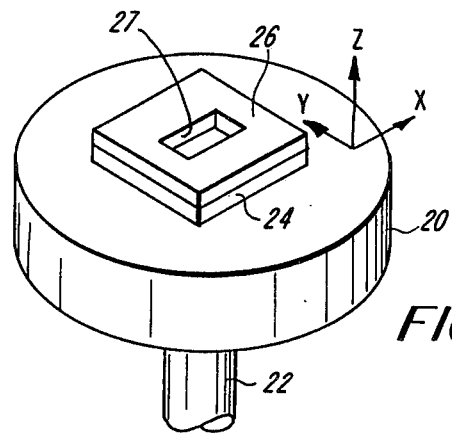
FIG. 2 is a perspective view of the susceptor of the system shown in FIG. 1 with a generic illustration of the mask as applied to a semiconductor structure upon which deposition is to occur.
Figure 3:
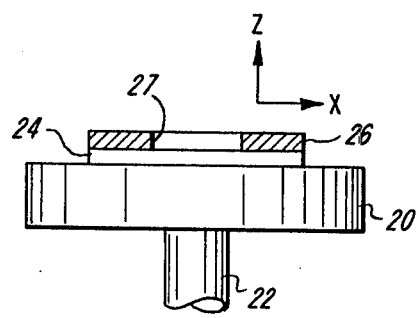
FIG. 3 is a side elevation of the view shown in FIG.2. In this Figure and subsequent Figures, the mask according to this invention is shown in cross hatched lines for purposes of clarity.

The simplest mask structure is shown in FIGS. 2 and 3. Mask 26 comprises a flat composite having at least one aperture 27. Mask 26 may be integral with structure 24, such as, an layer or film, or may be a removable structure. The mask 26 may be made of any number of materials, such as, silicon dioxide, gallium aluminum arsenide, gallium arsenide, silicon nitrite, aluminum oxide, etc.

Special consideration can be given in mask design in order to minimize contamination and to restrict the flow of reactant gases around and from regions under the mask. This is particularly true for removable masks.

Figure 4:
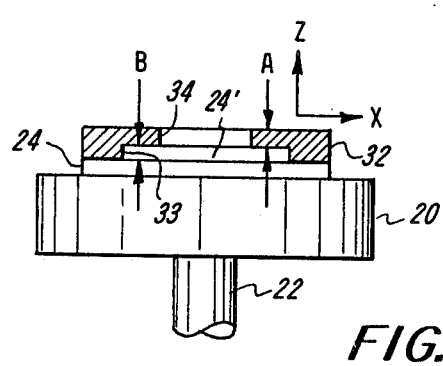
FIG. 4 is a removable mask according to this invention, and having a cavity so that the mask aperture is spaced from the surface of the structure upon which deposition is to occur.

In FIG. 4 the removable mask 32 has an outer perimetrical lip 33. Mask 32 also has an aperture 34. Positioning of the mask 32 on structure 24 provides for the aperture 34 to be spaced from the surface 24' on which deposition is to occur. The configuration of this particular mask structure, as compared to mask 26 in FIG. 2, is that growth will be permitted to extend over surface 24' beyond the confines or dimensions of the aperture 34.

The reactor 18 can be modified to include an assembly within the reactor to provide for the insertion and removal of masks during the deposition processes.

An example of the employment of a mask 32 is as follows. Mask 32 was made of silicon with <110> orientation. The mask was about 3 mils thick (dimension A in FIG. 4) and the width of the aperture was 5 mils wide and 25 mils long. The spacing B was about 6μm. The growth on the surface of the structure 24 was of Gaussian shape about 10 mils wide, 30 mils long and 4.4 μm high. The contour of the growth was similar to the contour pattern 66 shown in FIG. 10.

Figure 5:
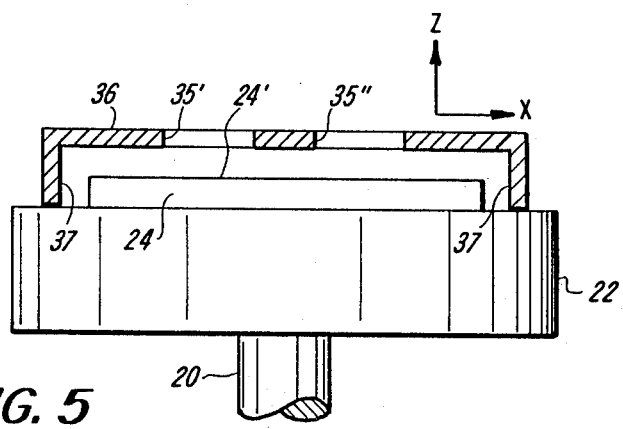
FIG. 5 is another removable spaced mask similar to that shown in FIG. 4 but supported in alternate manner.

In FIG. 5, mask 36 is similar to mask 32 in FIG. 4 except it is provided with a perimetrical lip 37 for supporting the mask in spaced relation from surface 24'( of semiconductor structure 24. Lip 37 is designed to engage the surface of susceptor 22 leaving no spacing for reactant gases to escape under the mask lip 37. Mask 36 is also shown with two apertures 35' and 35".

Figure 6:
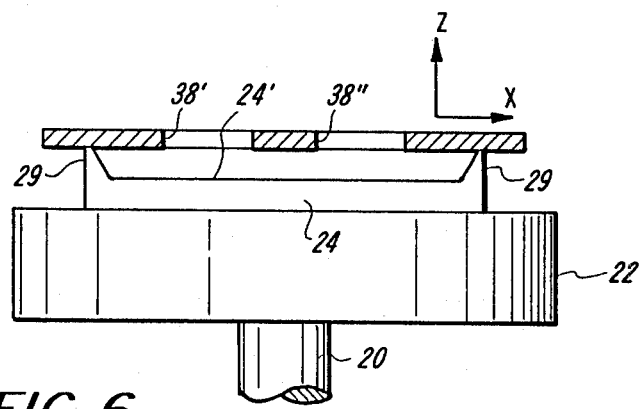
FIG. 6 is still another removable, spaced mask similar to that shown in FIGS. 4 and 5 but supported in an alternate manner.

In FIG. 6, mask 38 is also provided to be maintained in spaced relation from the surface 24' of a semiconductor structure 24. The spaced relation, however, is accomplished by the perimetrical edge or lip 29 provided on the semiconductor structure 24. Mask 38 is planar has two apertures 38' and 38".

Mask 32, 36 and 38 in FIGS. 4-6 are all designed to be removable masks, that is, they are employed during the growth process and may subsequently by removed prior to the completion of processing in reactor 18.

Figure 7:
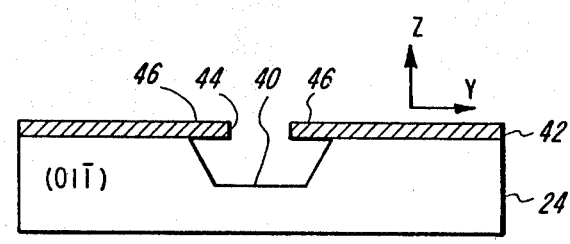
FIG. 7 is an integral mask according to this invention, and integral with a semiconductor structure comprising a semiconductor substrate.
Figure 8:
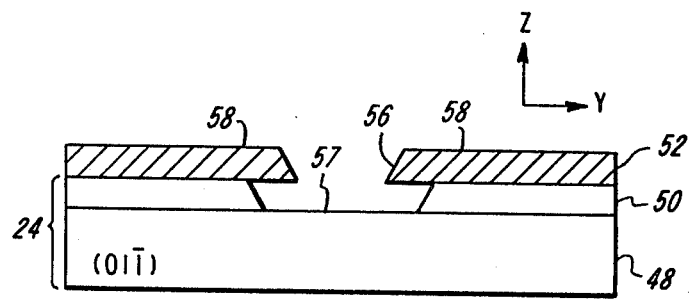
FIG. 8 is another illustration of an integral mask according to this invention integral with a semiconductor structure comprising a semiconductor layer or film deposited on a semiconductor substrate.
Figure 9:
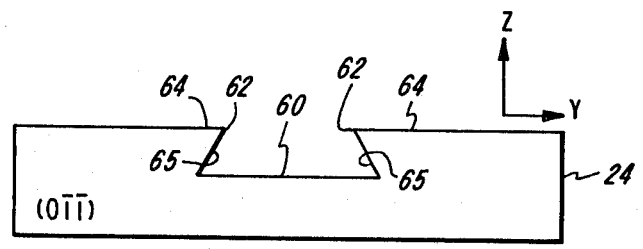
FIG. 9 is another illustration of an integral mask which is formed as part of a semiconductor structure comprising a semiconductor substrate.

The mask structures shown in FIGS. 7, 8 and 9 are integral masks. In FIG. 7, the semiconductor structure 24 is provided with a channel 40. A deposited mask 42 is provided with an aperture 44 aligned with the center of channel 40. The mask layer 42 may comprise polycrystalline material, a amorphous material or a single crystal material. For example, structure 24 may be a substrate of gallium arsenide (GaAs). Mask 42 may comprise a deposited layer of $SiO_2$, $Si_3N_4$ or $Al_2O_3$. A important aspect of mask 42 is the cantilevered lips 46 extending over the channel 40 of the semiconductor structure 24.

The self-aligned mask 42 is made by the vapor deposition of $SiO_2$ on the substrate 24. Next, an elongated aperture 44 is etched through the $SiO_2$ mask layer employing a $SiO_2$ etch. This is followed by a selective etch for GaAs to form the channel 40 in substrate 24 through the aperture 44. This two step etching process leaves the mask cantilevered lips 46 over both sides of the channel 40. With this type of mask structure, growth of nonplanar layered structures can easily be performed by MO-CVD. In the case of the example of the previous paragraph, the growth through the $SiO_2$ masked aperture 44 on the GaAs substrate will be crystalline while the growth on the surface of the mask will be polycrystalline. Discussion concerning growth will be explained in greater detail in subsequent figures.

In FIG. 8, semiconductor structure 24 comprises a substrate 48 on which is a deposited layer 50. Layer 50 may comprise, for example $Ga_{1-x}Al_xAs$. Mask layer 52 is deposited on layer 50 and will subsequently be the mask structure for the semiconductor structure 24. Substrate 48, for example, may be <100> orientation, n-doped GaAs. Layer 50 may be $Ga_{0.4}Al_{0.6}As$. Mask layer 52 may be undoped GaAs. Layer 52, as well as other integral mask layers to be hereinafter discussed, may be proton or ion implanted or oxygen or Ge doped to render then electrically insulating. Such a layer may form part of the current confine structure of semiconductor device comprising a plurality of semiconductor layers subsequently deposited through aperture 56 in channel 57.

Layer 52 may also be n-doped GaAs while layer 50 may be p-doped $Ga_{1-x}Al_xAs$ to form a reverse junction and form part of the current confinement means for a semiconductor device deposited in channel 57.

Figure 34:
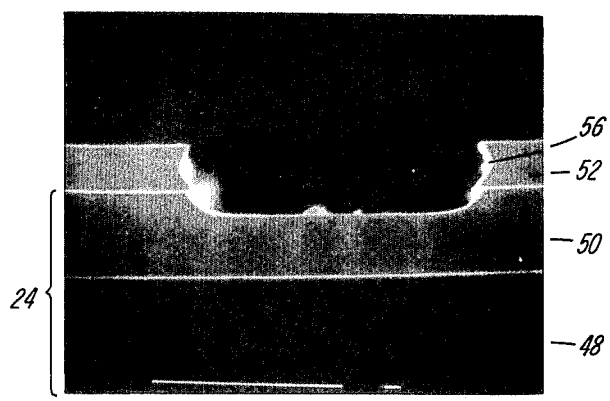
FIG. 34 is a scanning electron microscope photomicrograph of a side elevation a semiconductor structure after completion of an initial etching step, the structure comprising a semiconductor substrate and two contiguous, deposited semiconductor layers.
Figure 35:
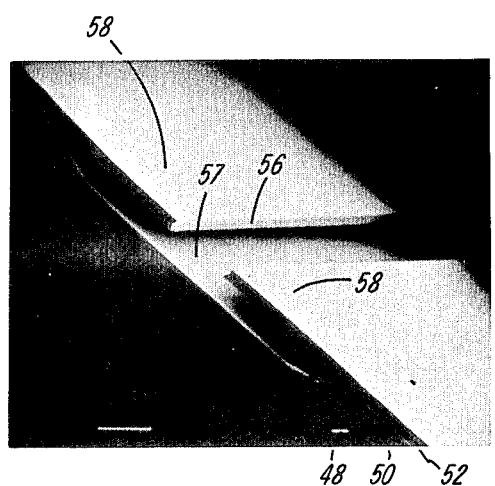
FIG. 35 is a photomicrograph of the structure shown in FIG. 34 after completion of a second etching step, the structure now being the same as that shown in FIG. 8.

The preparation of this mask structure for subsequent growth is accomplished as follows, reference being made also to the microphotographs of FIGS. 34 and 35. FIG. 35 is an actual photomicrograph of the structure illustrated in FIG. 8 except for substrate orientation. With selective masking, an elongated aperture 56 is etched through the gallium arsenide layer 52. FIG. 34 shows the result of this single etching step wherein the etchant has also extended a little into the intermediate layer 50 of $Ga_{1-x}Al_xAs$. This first etching step is followed by a second etching step comprising an etchant for $Ga_{1-x}Al_xAs$ such as, HCL or HF etchant. The mask aperture 56 now performs the function of a mask for performing this second etching step. The etching process, over a selected period of time, will produce a channel 54 in layer 50 and extending beneath the elongated edges of the aperture 56 forming the extended cantilever lips 58. The structure resulting from this second etching step is shown both in FIGS. 8 and 35.

The edges of the lips 58 can have different angled contours depending on the crystal orientation of structure 24. For example, in FIG. 8, the upwardly open beveled edges are obtained by a <100> orientation of the substrate 48 with the etched channel perpindicular to the (01$\bar{1}$) cleavage plane. On the other hand, V-shaped edges are obtained by a <100> orientation of the substrate 48 with the etched channel perpendicular to the (0$\bar{1}\bar{1}$) cleavage plane, as illustrated in FIGS. 34 and 35.

Figure 36:
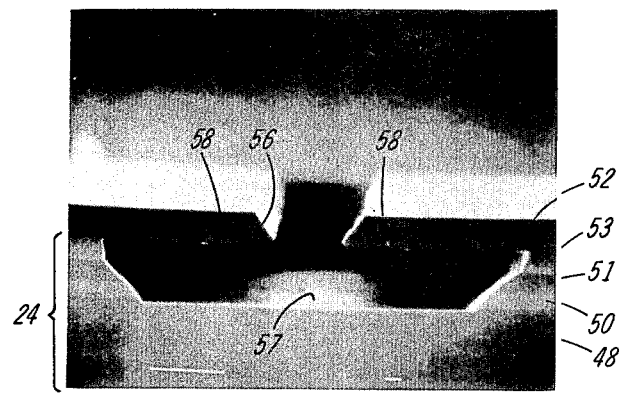
FIG. 36 is a photomicrograph of a side elevation of a semiconductor structure similar to that shown in FIG. 35 except the structure includes several intermediate deposited semiconductor layers.

The photomicrograph shown in FIG. 36 is similar to that shown in FIG. 35 except that the structure 24 comprises two additional deposited layers. Structure 24 may, for example, comprise a <100> orientation substrate 48, an undoped layer 50 of $Ga_{0.4}Al_{0.6}As$, a p-type 51 of $Ga_{0.4}Al_{0.6}As$. an n-type layer 53 of $Ga_{0.4}Al_{0.6}As$ and the single crystal mask 52 of undoped GaAs with the channel etched perpendicular to the (011) cleavage plane. Layers 51 and 53 will form a reverse junction forming part of the current confinement for a semiconductor device formed in channel 57.

The mask structure need not be formed as as integral layer or a film on the semiconductor structure 24. As shown in FIG. 9, the mask structure may be actually part of the semiconductor structure 24, per se. Using a GaAs etch, a mask opening is formed in the body of the substrate forming a dovetail channel 60 defining an aperture 62 and forming the elongated lips 64. The channel 60 etched perpendicular to the (0$\bar{1}\bar{1}$) cleavage plane is sufficiently deep so as to function as a mask structure to obtain contoured growth on the surface of the channel. The profile of the side walls 65 of the channel can be varied depending upon the etchant as is known in the art. See, for example, the channel profile in FIG. 13.

In all of these removable and integral mask structures in FIGS. 4–9, MO-CVD growths may be performed through the apertures of the masks by the deposition of materials or compounds from the reactant gases onto the surfaces of the channels formed beneath the mask apertures. The extent of the growth, that is, the height, thickness and curvature of the growth is controlled by the size and shape of the mask aperture, the thickness of the mask and the amount of the channel volume beneath the mask.

A rule of thumb is that the width of the mask aperture should be greater than thickness of the mask. This ratio is particularly important in order that a major portion of the reactant gases make initial contact and deposit on the channel bottom beneath the mask aperture before making substantial contact with the surfaces of the mask aperture edges or channel extremities. In this sense, the mask thickness should be comparatively thin, but this dimension also depends on the mask aperture width.

The thickness, for example, of a removable or integral type mask may typically vary between 2 to 5 mils with an aperture width between 4 to 8 mils. A specific example would be a mask 3.5 mils thick at the mask lips with an aperture width of 4 to 5 mils, following the above mentioned rule. Thinner mask dimensions are more easily achieved with integral masks. The thickness and aperture width of integral masks may typically be 1 to 5 μm and 2 to 30 μm, respectively.

By the use of these mask structures, a three dimensional controlled, contoured growth is possible in MO-CVD. The preferred mask design for contoured shapes and configurations is to have a region (e.g. channel 57) under the mask in which the reactant gases can spread laterally, depositing compounds in the channel volume in a tapered or contoured manner. The channel volume and mask aperture width selection permit control over both aspects of spatial variation of the growth: (1) the curved contour and extent of the growth and (2) the thickness and height of the growth, albeit a single layer or a plurality of layers. The wider the aperture, the lower the taper rapidity of the growth, i.e. a more level growth profile, with channel volume presumed constant. With the same mask and channel parameters, the spatial variations of the growth may be reproduced in a continuous and substantially identical manner.

Figure 10:
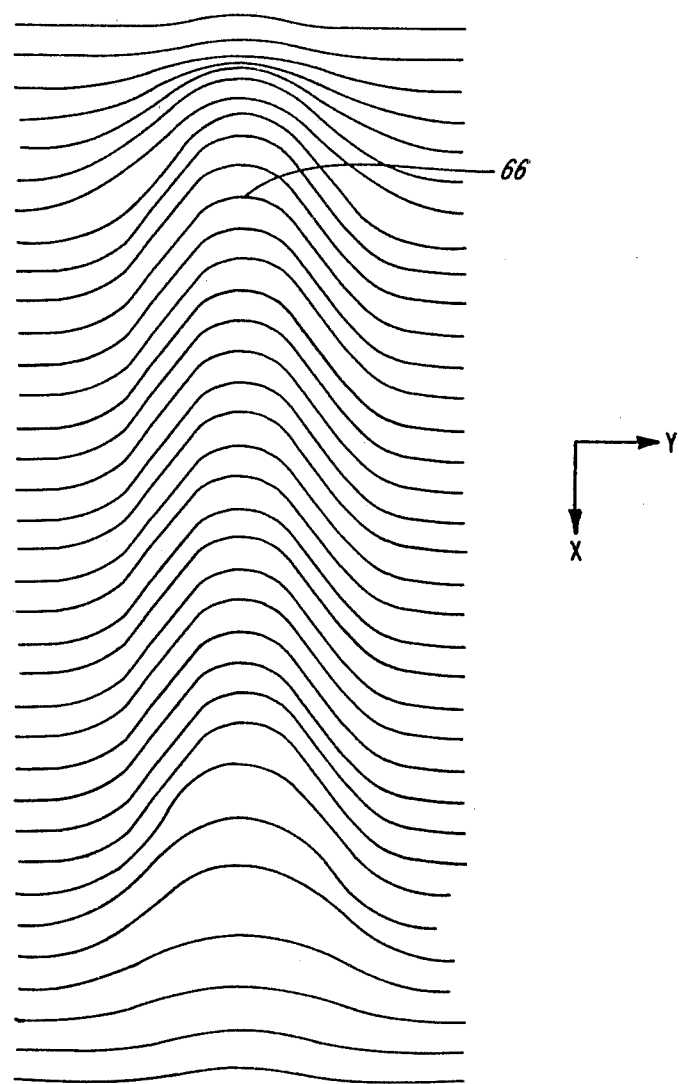
FIG. 10 is a graphic illustration of the contour and shape that may be grown through the aperture of a mask according to the method of this invention.

A three-dimensional type profile or pattern 66 of a contoured growth with a Gaussian shaped cross section is illustrated in FIG. 10. These mesa like patterns may be employed in the fabrication of semiconductor devices requiring three dimensional contours, such as, the formation of active regions in injection lasers having desired spatial variations in tapered contour and thickness.

The preceding discussion has been in connection with the fabrication of different types of mask structures. The description of the remaining figures involves the use of various removable and fixed mask structures in the deposition of one or more layers of semiconductor compounds in MO-CVD.

The purpose of FIGS. 11 through 31 is to illustrate the different type of growths possible with various types of integral and removable mask configurations. FIGS. 11 through 18 illustrate integral type mask structures. In these Figures mask overgrowth is shown since the mask remains as an integral part of the fabricated device. FIGS. 19 through 31 illustrate removable mask type structures. In all these Figures, the mask structures are shown cross-hatched for purposes of clarity. In the figures relating to removable mask structures, overgrowth on the mask is not illustrated since the masks are removed during or after completion of growth.

The growth in FIGS. 11 through 31 is performed in the MO-CVD system 10 of FIG. 1 and in most cases is shown as a single layer for purposes of simplicity. This representation, however, is also intended to represent the bulk of a plurality of deposited layers, such as, illustrated in FIG. 31. Detailed multilayer structures are discussed in FIGS. 32, 33, 37, 38 and 39.

In FIGS. 11 through 15, the structures shown each comprise an oriented crystalline semiconductor (such as, doped or undoped GaAs) substrate 70, an oxide ($SiO_2$) or nitride ($Si_3N_4$) mask 72, a polycrystalline growth 74 over the mask surface and a single crystal growth 76 deposited through the aperture 78 of the mask 72. The growth 76 forms a spatial variation in tapered contour or rapidity and in thickness, as illustrated at 80. The growth extends in a uniform contoured shape in the substrate channels 71, 73 and 75 away from the central axis of the aperture 78 toward the channel extremities. Also the growth extends around the edges of the mask lips 82 and tapers on the undersurfaces of the mask lips toward the channel extremities.

Figure 11:
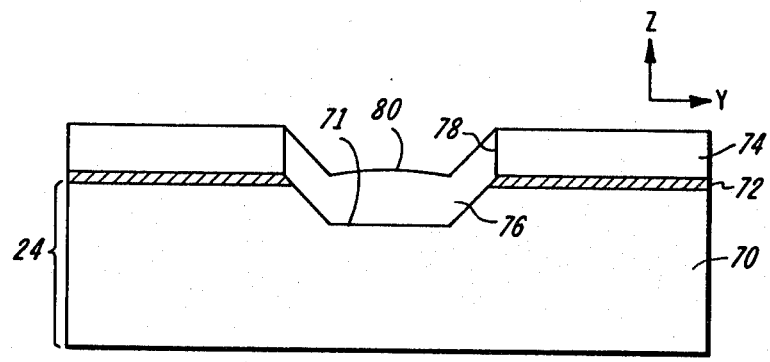
FIGS. 11 and 18 are diagrammatic illustrations relating to integral mask configurations. For purposes of simplicity, the growth is shown, in most cases, as a single layer but representative, however, of one or more deposited layers of different elemental compounds.

In FIG. 11, a selective etch is performed to form the elongated aperture 78 in layer 74. Channel 71 is formed, as by selective etch, into the substrate 70 forming channel 71. Two different etchants may be needed for etching the materials of the mask and of the substrate.

Figure 12:
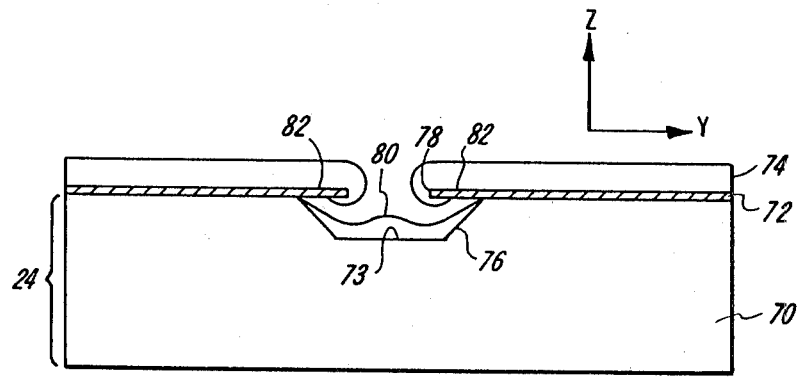
FIG. 12 is a side elevation of a channeled semiconductor structure similar to FIG. 11 but having a mask lip or overhang.
Figure 13:
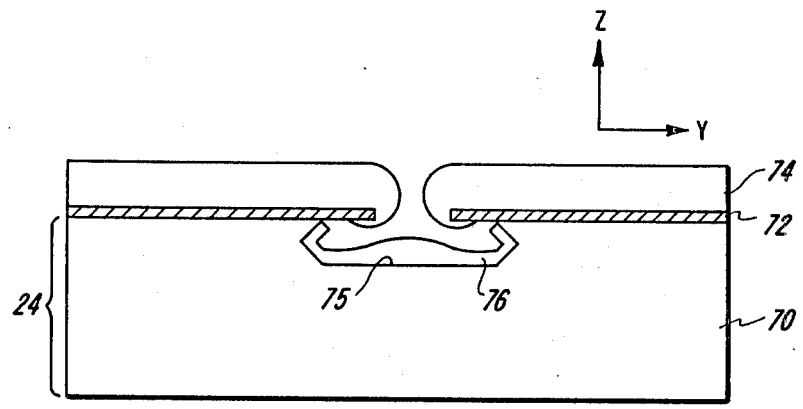
FIG. 13 is a side elevation of a channeled semiconductor structure similar to FIG. 12 but having a differently shaped structure channel.

In FIGS. 12 and 13, the substrate channels 73 and 75 are formed by an etchant that is not effective on the mask material, as previously explained relative to FIG. 7. A two step etching treatment forms the channels 73, 75 and mask lips 82. The difference in the cross-sectional shape of channels 73 and 75 is due to crystal orientation of structure 24, as known in the art.

Figure 14:
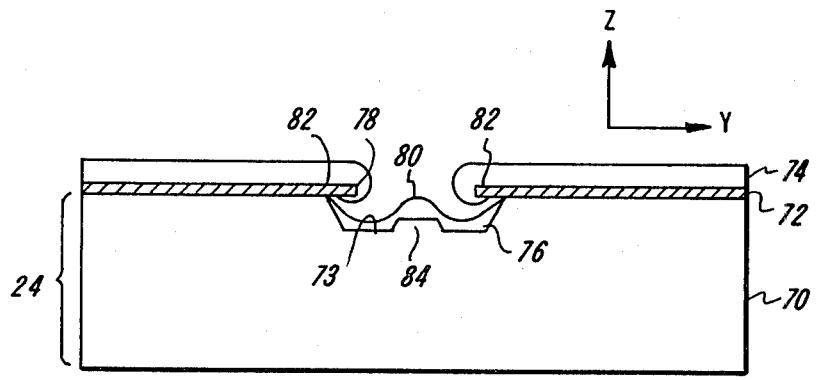
FIG. 14 is a side elevation of a channeled semiconductor structure similar to FIG. 12 but having a mesa formed in the channel.

In FIG. 14, the thickness variation is more pronounced and the taper rapidity is greater, as compared to previous structures, due to the presence of the mesa 84 formed in channel 73. Mesa 84 is easily formed by stripe masking the central portion of channel 73 and proceeding further with the second etching step.

Figure 15:
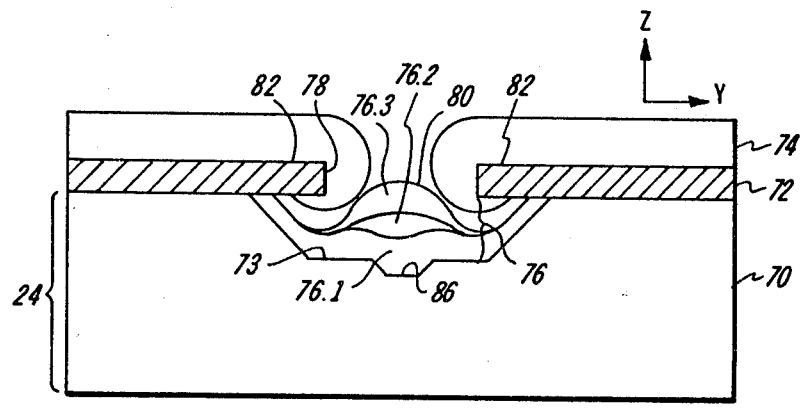
FIG. 15 is a side elevation of a channeled semiconductor structure similar to FIG. 12 but having another channel formed in the main channel of the structure.

In FIG. 15, a second channel 86 is formed in substrate channel 73 employing conventional selective mask techniques. Composite layers 76.1, 76.2 and 76.3 demonstrate the different shaped contours that can be formed when sequentially depositing different elemental compounds through mask aperture 78. Layer 76.1 is contoured concave due to the presence of channel 86. However, during the growth of layer 76.2, this will eventually become planar due to the presence of the apertured mask 72. Continued growth of layer 76.2 will become convex contoured so that layer 76.2 will have an eye shaped contour. The final layer 76.3 has an even more convex contoured as the growth reaches the aperture 78.

Figure 16:
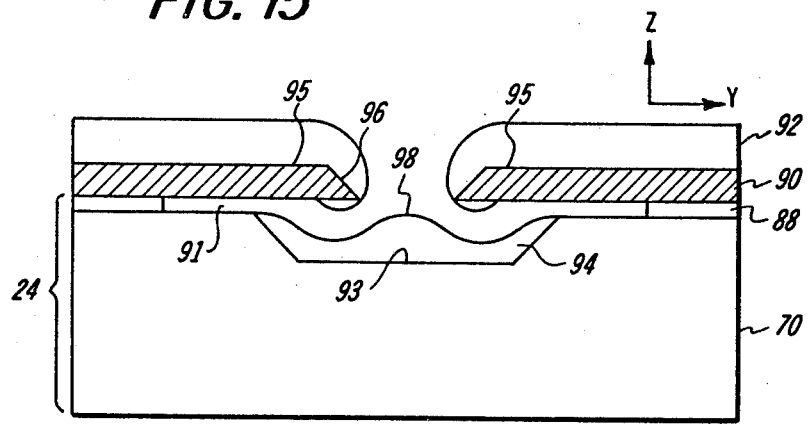
FIG. 16 is a side elevation of a channeled semiconductor structure similar to FIG. 12 except that the semiconductor structure comprises an intermediate deposited layer between a semiconductor substrate and a deposited mask.
Figure 17:
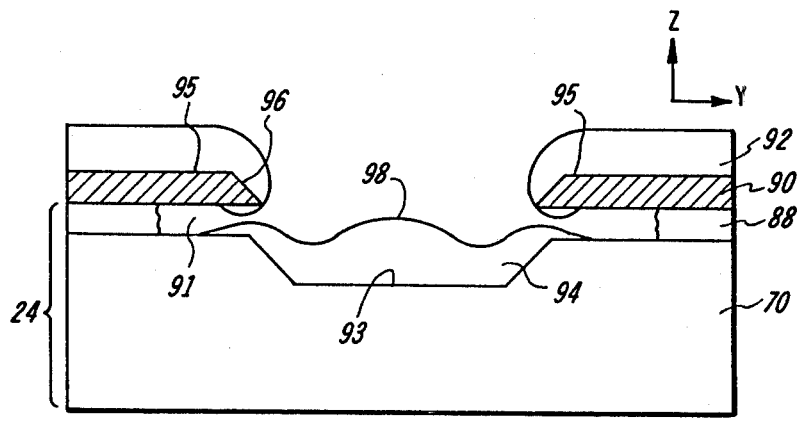
FIG. 17 is a side elevation of a channeled semiconductor structure similar to FIG. 16 except the deposited intermediate layer is of thicker cross-section.
Figure 18:
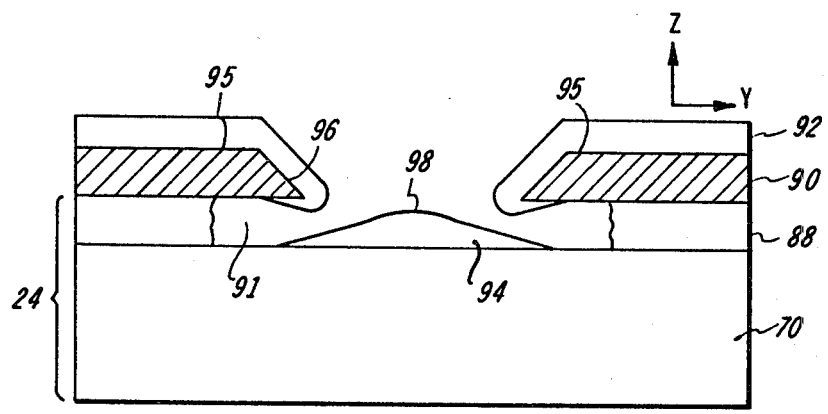

In FIGS. 16 through 18, the structures shown each comprise an <100> oriented crystalline semiconductor (such as, doped or undoped GaAs) substrate 70, a single crystal layer 88 (such as, for example, $Ga_{1-x}Al_xAs$ where $0.3<x<1$), a single crystalline mask 90 (such as, for example, $Ga_{1-y}Al_yAs$ where $0<y<0.3$), a single crystal growth 92 over surface of the mask 90 and a single crystal growth 94 deposited through the aperture 96 of the mask 90. The growth 94 forms a spatial variation in tapered contour and in thickness as illustrated by the contour 98.

In the structures of FIGS. 16 and 17, three different etching steps are performed prior to growth. First, there is selective etching of the mask 90 to form the mask aperture 96. The completion of this step is illustrated in FIG. 34, as previously discussed. The second step is the etching of the channel 93 through layer 88 and into the substrate 70. The third step is the etching of layer 88 through the mask aperture 96 to form channel 91 in layer 88, producing the cantilever lips 95. The structure shown in FIG. 18 differs from those of FIGS. 16 and 17 in that the second etching step is not performed, i.e., there is no channel 93. The structure of FIG. 18 is the same as that shown in the photomicrograph of FIG. 35 except for initial substrate orientation.

To be noted from FIGS. 16 through 18 is the differences in the degree of taper rapidity 98 and growth thickness of growth 94 due to differences in the width of the aperture 96, the thickness of the mask 90, the thickness of layer 88, the volume and width of channel 91 and the presence or absence of the substrate channel 93.

While the mask structures of FIGS. 11–18 are characterized as integral, the overgrowth 72 and 94 and even the masks 72 and 90 may be removed, as by wet or dry (plazma) etching, before completion of further fabrication processes.

In FIGS. 19 through 31, the structures shown each comprise an oriented crystalline semiconductor substrate 70, such as, GaAs, a removable mask structure having an aperture 105, and a resultant growth 100 formed on the surface of the substrate employing MO-CVD system 10. These removable mask structures may be fabricated from Si, GaAs, SiC, Graphite, $SiO_2$, $Si_3N_4$, $AL_2O_3$ as well as many other types of materials. Each of the mask structures shown in these figures has a different attribute. In some cases there is a modification to the substrate depositing surface. These different configurations illustrate how variations in the mask parameters and geometry are employed to control and produce desired spatial variations illustrated by the contour 102 of each of the growths 100.

Figure 19:
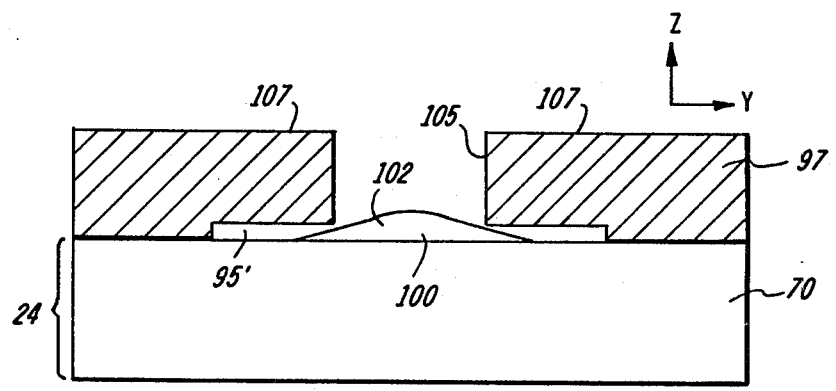
FIGS. 19 through 31 are diagrammatic illustrations relating to removable mask configurations. For purposes of simplicity, the growth is shown, in most cases as a single layer but representative, however, of one or more deposited layers of different elemental compounds.

In FIG. 19 the mask 97 is provided with an aperture 105 and an undergroove or channel forming the lips 107 and chamber 95' when the mask is positioned on the surface of the structure 24. Mask 97, as positioned on substrate 70, is similar to the integral mask configuration shown in FIG. 18. Thus, the spatial variation of resultant growths 98 and 100 in these Figures are quite similar.

Figure 20:
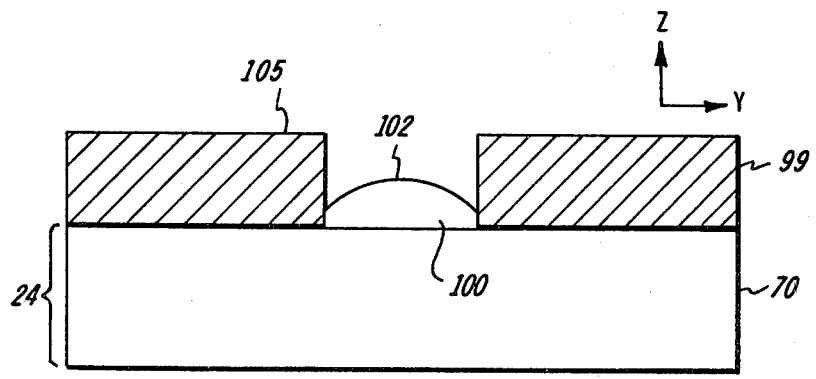
Figure 21:
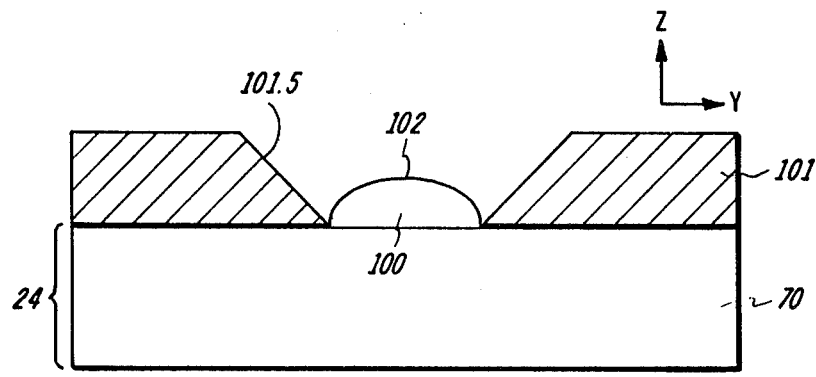
Figure 22:
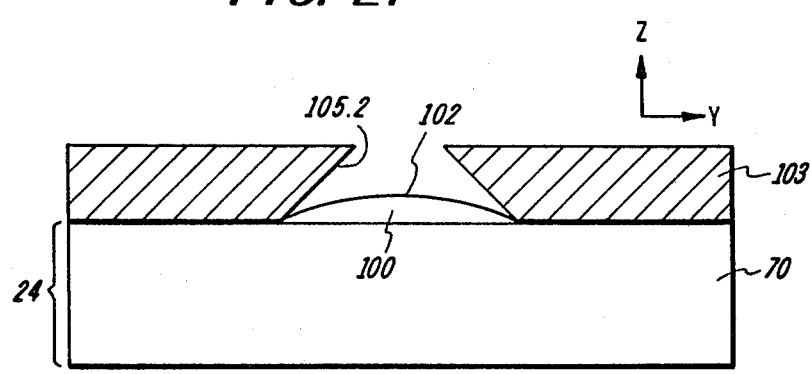

In FIG. 20, mask 99 has a flat configuration. Masks 101 and 103 of FIGS. 21 and 22 are also flat mask configurations with mask 101 having an outwardly beveled mask aperture 105.1 and mask 103 having an inwardly beveled mask aperture 105.2. To be noted is the difference in the contour of the growths 102 due to the difference in these mask apertures. The rapidity of spatial variation relative to the contoured curvature and thickness of the growth 100 is quite pronounced in FIGS. 20 and 21 as compared to the same spatial variation for the growth 100 in FIG. 22.

Figure 23:
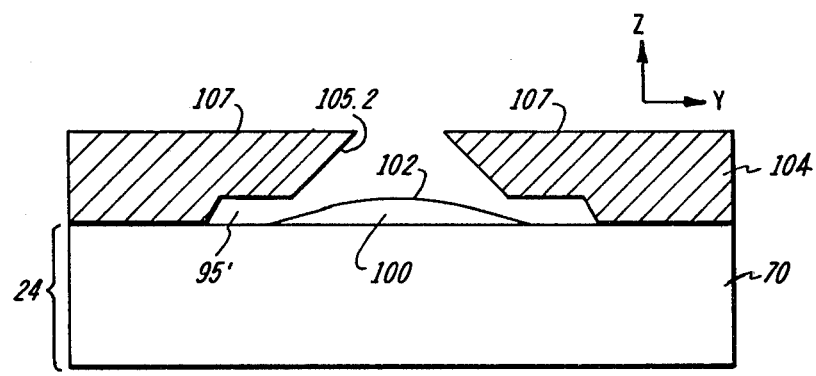
Figure 24:
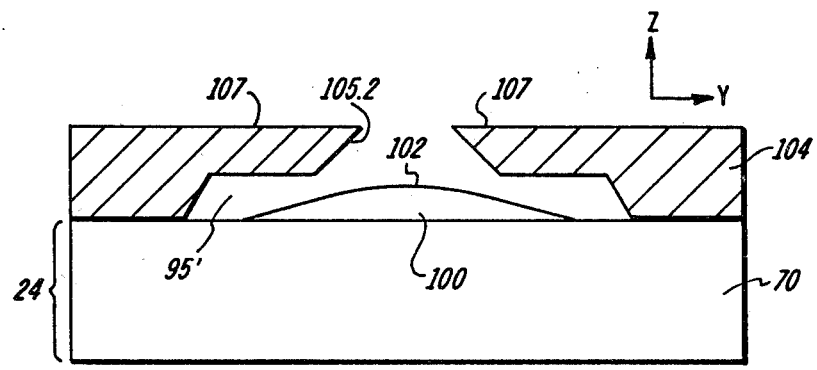

In FIG. 23, mask 104 is of similar configuration to mask 97 of FIG. 19 but has a mask aperture 105.2 like that shown in FIG. 22. The spatial variation relative to the tapered contour is similar to that of growth 100 in FIG. 22 but is of reduced taper rapidity. The taper rapidity can be increased for growth 100, as evidenced by FIG. 24, by increasing the aperture width and the extent or volume of chamber 95'.

Figure 25:
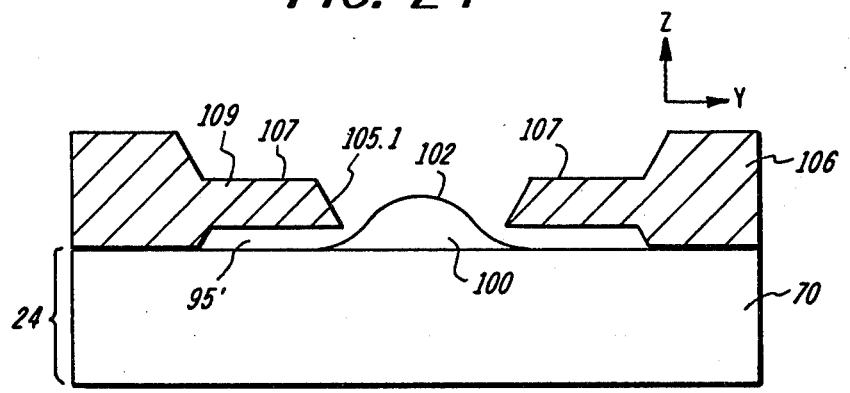

In FIG. 25, mask 106 has an upwardly beveled aperture 105.1 in combination with a mask cavity to form chamber 95'. Mask 106 is also provided with lips 107 that include recess 109. Recess 109 provides for a thinner mask thickness at the aperture 105.1 which will provide a larger growth 100. To be noted is the extended nature of the growth 100 as compared to the growth 100 in FIG. 21 but having a larger taper rapidity as compared with the growths of FIGS. 23 and 24.

Figure 26:
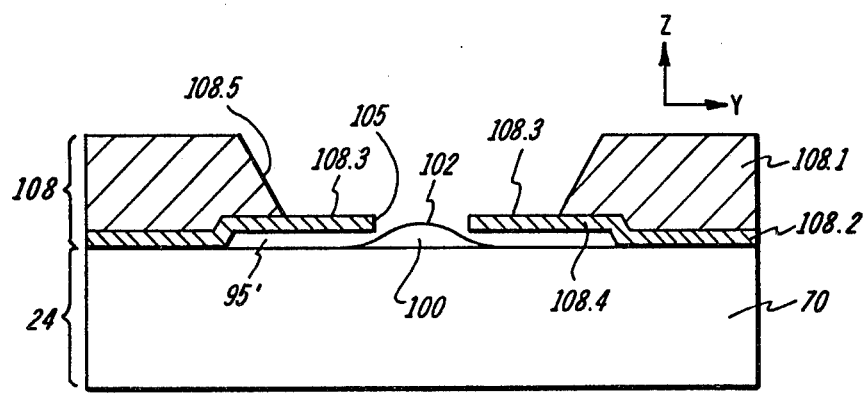

In FIG. 26, there is shown a composite mask 108 consisting of two components. Component 108.1 may comprise, for example, graphite, Si or GaAs. The thinner component 108.2 may comprise SiC, $SiO_2$, $Si_3N_4$ or $Al_2O_3$. A preferred combination of materials for components 108.1 and 108.2 is graphite for component 108.1 with SiC for component 108.2 because these materials can be made to match relative to strain and thermal expansion. The advantage of this composite mask is that the larger component 108.1 is a rigid support for the much thinner mask component 108.2. The composite mask 108 is designed for fabricating much smaller dimensional growths where the mask aperture 105 may be less than 6 μm wide and the channel about 3 μm deep.

Composite mask 108 is fabricated by first etching the channel pattern 108.4 in the bottom of component 108.1 of oriented crystalline silicon. Next, a film of $SiO_2$ (such as 0.1 to 2 μm) is deposited on the etched surface forming component 108.2. Third, an $SiO_2$ selective etch is performed to form the mask aperture 105. Last, the opposite surface of component 108.1 is etched to form the recess 108.5 the etchant used does not etch component 108.2. Composite mask 108 is a simple structure to produce and has its greatest utility in fabricating micro growths 100.

FIGS. 27 through 31 disclose removable masks employed with channeled structures 24. In each of these figures, growth 100 occurs in the channel 111 of the substrate 70 below the aperture 105 of the mask structure, producing different, desired spatial variation in the contours 102.

Figure 27:
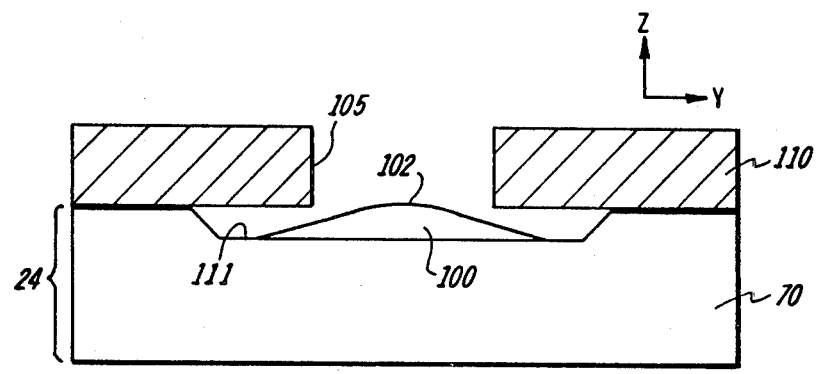

In FIG. 27, the substrate 70 is provided with a channel 111. Mask 110 has a flat configuration. The channel 111 permits the growth to spread laterally beneath the mask during deposition.

Figure 28:
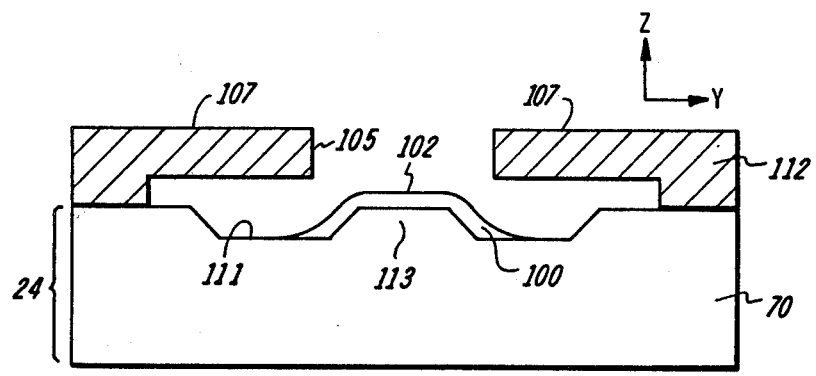
Figure 29:
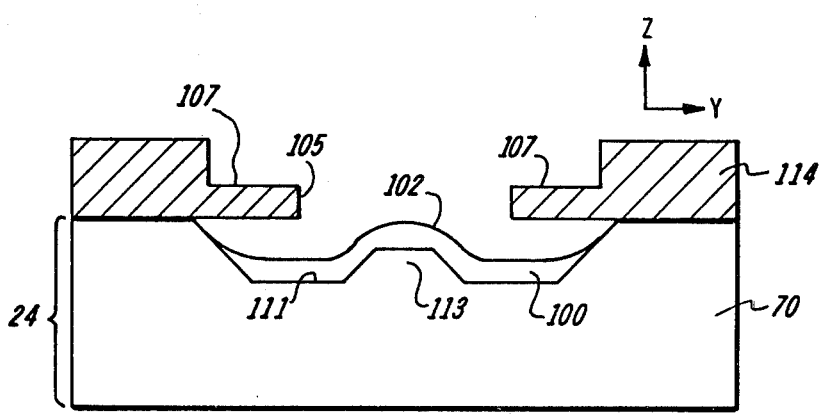

The configurations of FIGS. 28 and 29 are similar to FIG. 27 except for the mask lip. Substrate 70 is also provided with a channel 111, as in the case of FIG. 27, but the channel further includes the mesa 113. The mask lips 107 are formed by selective etching a channel into a surface of the mask structure 112, 114. This enlarges the volume of the chamber formed below the mask when the mask has been positioned on the substrate 70 thereby permitting enhancement of the lateral extent of the deposition. In FIG. 29, the mesa 113 is narrower in width than mesa 13 in FIG. 28.

Figure 30:
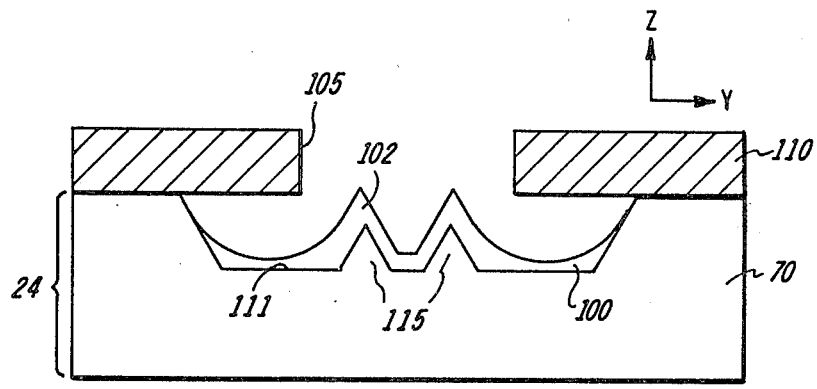

In FIG. 30, the structure 24 and mask 110 are geometrically the same as that shown in FIG. 27, except that channel 111 is provided with a pair of mesas 115 having a triangular cross-section. This configuration will provide for high and abrupt spatial variations in the contour 102.

Figure 31:
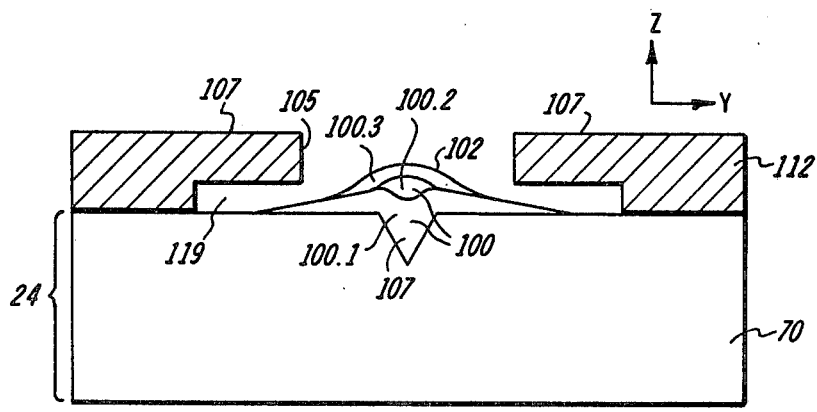

In FIG. 31, substrate 70 has a V-shaped channel 117. Mask 112 of FIG. 28 is employed to provide the channel or spacing 119. Growth 100 comprises three layers 100.1, 100.2 and 100.3. Additional layers may be deposited on layer 100.3. Because of the mask aperture 105, the extent of channel 119 and the presence of channel 117, a MO-CVD fabricated device may be provided with a completely buried strip in the form of layer 100.2. For example, strip 100.2 may be doped or undoped GaAs and function as the strip active layer or region in a strip heterostructure injection laser.

Reference is now made to FIGS. 32 and 33 which disclose semiconductor heterostructure injection lasers fabricated in MO-CVD employing the removable mask techniques just discussed.

In FIGS. 32 and 34, heterostructure injection lasers 120A and 120B comprise substrate 122 of n-GaAs and epitaxial growth 126. Growth 126 comprises n-$Ga_{1-x}Al_xAs$ cladding layer 126.1, undoped GaAs active layer 126.2 and p-$Ga_{1-x}Al_xAs$ cladding layer 126.3. Additional GaAs/GaAlAs layers may be provided in the structure as contact and additional cladding layers, as is well known in the art.

Growth 126 is formed in channel 124. A removable mask, such as, mask 110 or 112, may be employed and is positioned on the surface of substrate 122 during growth in reactor 18. After completion of the deposition of growth 126, the structure is removed from reactor 18 and the mask is removed. Selective proton or ion implant 128 is performed to form the insulating barrier, indicated by the dotted line in each of the Figures, leaving the semiconductive channel 136 for current confinement to the active radiation emitting region 126.20 of layer 126.2. Such a current confinement technique is known in the art. It should be noted that the implant penetrates through the active layer 126.2 but is sufficiently far enough from the lasing region 126.20 so as not to interfere with the operation of laser 120A, 120B.

The metalized layer 130 is, then, deposited on the top surface of the device and metal contacts 132 and 134 appropriately fixed. In the case of the metalization 130 in FIG. 33, there is a break 138 in the metalization due to applying the metalization vapor from an angular position as indicated by arrow 139.

These two laser structures demonstrate how removable masking in MO-CVD permits controlled optimization of the spatial variation 127 of the nonplanar active region 126.20 with desired taper rapidity and active region thickness in accordance with the teachings of U.S. Pat. No. 4,335,461.

Figure 37:
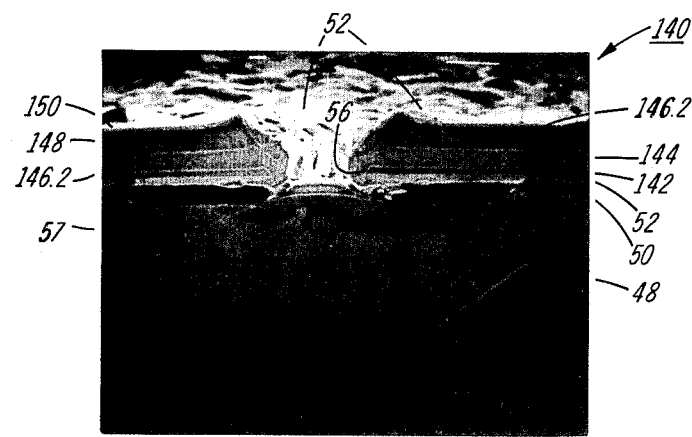
FIG. 37 is a photomicrograph of a side elevation of a double heterostructure injection laser grown by MO-CVD employing an integral single crystalline mask during growth.
Figure 38:
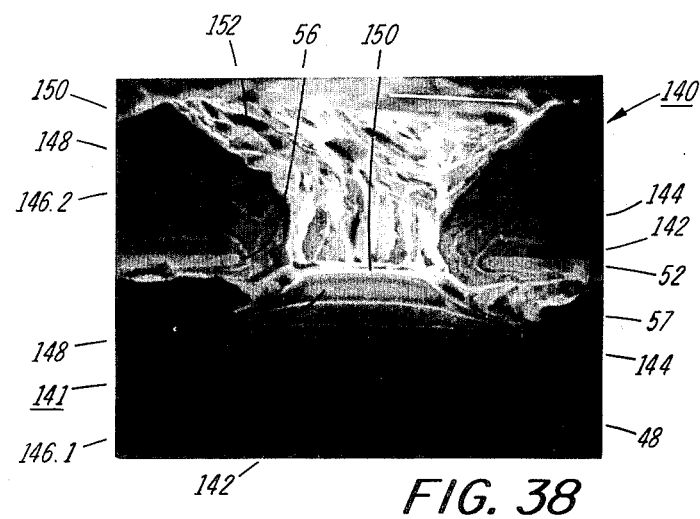
FIG. 38 is a photomicrograph of the same laser shown in FIG. 37 but of greater magnification.
Figure 39:
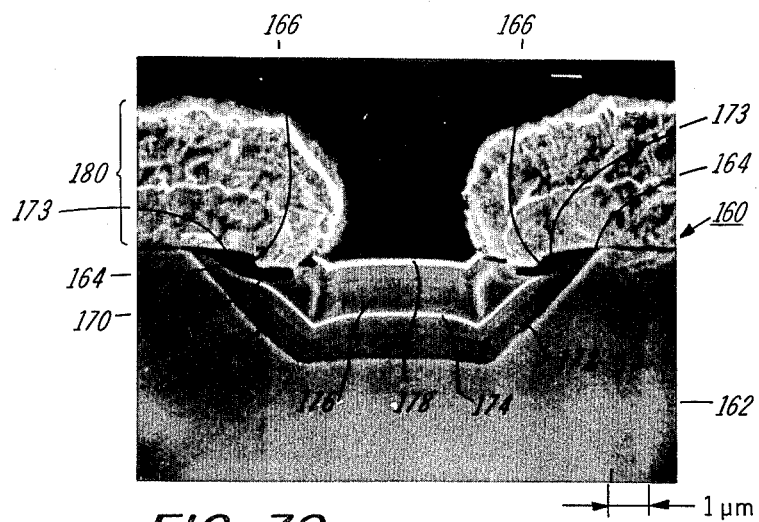
FIG. 39 is a photomicrograph of a side elevation of still another double heterostructure injection laser grown by MO-CVD employing an integral polycrystalline mask during growth.

FIGS. 37, 38 and 39 are photomicrographs of heterostructure injection lasers fabricated in MO-CVD using an integral mask. The laser structure of FIG. 37 differs from that of FIG. 39 by the material used for the mask. In FIG. 37, the mask is single crystalline material (GaAs), whereas in FIG. 39, the mask is an amorphous material ($SiO_2$). As a result, the growth on the amorphous mask will be polycrystalline while the growth on the single crystalline mask will be single crystalline, which is evident from an examination of these Figures.

An added advantage of the integral mask laser structures is that the presence of the mask aperture, which provides for in place, "automatic" alignment over the desired lasing region of the device. This greatly simplifies subsquent current confinement procedures and subsequently applied metalization. These is no necessity of an intermediate step to determine the center point of the deposited growth beneath the mask aperture.

In FIGS. 37 and 38, heterostructure injection laser device 140 is fabricated as follows: One starts with the structure shown in FIG. 35, the fabrication of which has been previously explained relative to FIG. 8. This structure comprises substrate 48 of <100> oriented n-GaAs with the etched channel perpendicular to the (011) cleavage plane, layer 50 of undoped $Ga_{0.4}Al_{0.6}As$ and mask 52 having an aperture 56 and etched chamber 57 formed under mask lips 58. Layer 50 and mask 52 may be fabricated of single crystalline materials having electrically insulating properties, such as, oxygen or Ge doped GaAs and GaAlAs.

The FIG. 35 structure is next placed on the susceptor 20 in reactor 18 and layers 142–150 are deposited forming the laser structure 141 in chamber 57 beneath the mask aperture 56. These layers comprise base layer 142 of n-GaAs, cladding layer 144 of n-$Ga_{0.7}Al_{0.3}As$, active layer 146 of undoped GaAs (active region 146.1 being part of laser structure 141 while the remaining portion 146.2 of this layer being deposited on the mask 52, as in the case of the other sequentially deposited layers), cladding layer 148 of a p-$Ga_{0.7}Al_{0.3}As$ and contact layer 150 of p-GaAs. Conventional polishing, metalizations for contacts, cleaning and bonding is then performed. A Cr-Au metallization is shown at 152 in FIGS. 37 and 38.

Because of the size of chamber 57, the width of mask aperture 56 and the control of the deposition rate, the spatial variation of active region 146.1 may be controlled in accordance with the teachings of U.S. Pat. No. 4,335,461.

In FIG. 39, the heterostructure injection laser device 160 is fabricated as follows. A 0.15 $\mu$m thick $SiO_2$ laser 164 is deposited by electron beam evaporation on a clean <100> oriented Si doped GaAs substrate 162. An 8 $\mu$m aperture 166 is then formed in the $SiO_2$ layer 164 by conventional photolithographic techniques and plasma etching. Next, about a 3 $\mu$m deep channel 168 is etched into the GaAs substrate by 5:1:1 solution of $H_2SO_4:H_2O_2$ and $H_2O$. The underetching below the $SiO_2$ mask 164 during this etching step creates the chamber 170 defined by the cantilevered lips 173 of mask 164 formed over the channel 168. The extent of each lip 173 is about 1.5 $\mu$m.

Since the aperture 166 in the mask 164 is narrower than the extent of chamber 170, the growth rate during deposition at the center of the channel 168 is faster than the growth rate in the channel beneath the mask lips 172.

During growth in system 10, the following single crystal layers are sequentially deposited through the mask aperture 166: cladding layer 172 of n-$Ga_{0.7}Al_{0.3}As$, active layer or region 174 of p or n doped or undoped GaAs, cladding layer of p-$Ga_{0.7}Al_{0.3}As$ and contact layer of p+ GaAs.

During growth, polycrystalline material, comprising the compounds of layers 172–178, is deposited on surface of mask 164 forming a polycrystalline electrically insulating layer 180.

The presence of the mask aperture 164 causes the materials to be deposited with a curved tapered contour in channel 168. Also, as the polycrystalline material forming layer 180 is deposited on mask 164, the aperture 166 narrows in width and thereby acts to increase the thickness of active layer 174 in the center of channel 168 as compared to lateral regions of the same layer (although this is difficult to discern from the micrographs becuase the thickness variations are very small). Thus, the ratio of the deminishing aperture width to the depth of each of the grown layers determines the final thickness variation that will occur laterally along each layer. This taper and thickness spatial variation provides lateral waveguidance, as taught in U.S. Pat. No. 4,335,461.

The measured light output versus current characteristics at 300K under pulsed operation (100 nsec pulse 1 kHz repetition rate) of various fabricated laser devices 160 produced linear optical power output up to 130 mA and a power output per facet in excess of 15 mW. In some cases, some of the fabricated devices 160 had a current threshold ranging from 32 to 42 mA.

Figure 40:
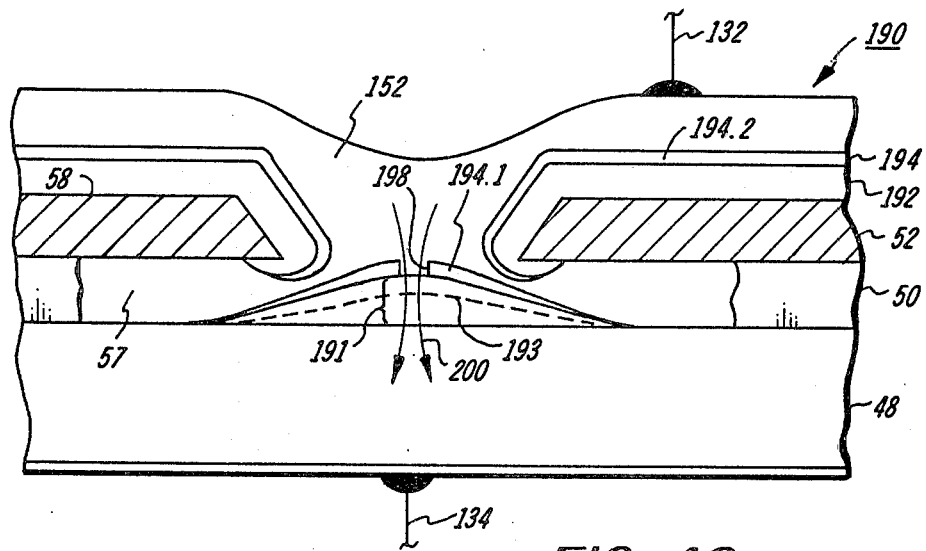
FIG. 40 is a diagrammatic illustration of a partial side elevation of an injection laser grown by MO-CVD employing an integral mask and illustrating current confinement and alignment techniques in completing the fabrication of the laser.
Figure 41:
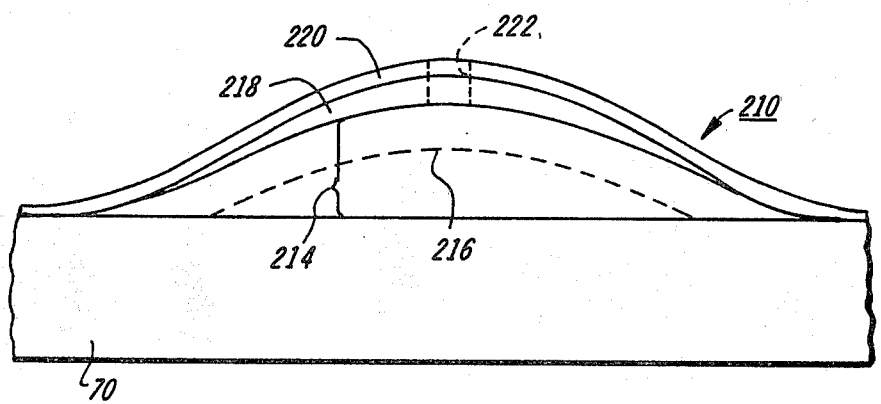
FIG. 41 is a diagrammatic illustration of a partial side elevation of an injection laser grown by MO-CVD employing a removable mask and illustrating current confinement and alignment techniques toward completing the fabrication of the laser.

FIGS. 40 and 41 illustrate how more refined stripe alignment and current confinement may be provided in the previously described laser devices 120, 140 and 160.

In FIG. 40, MO-CVD fabricated laser device 190 includes laser structure 191, generally identical to structure 141 in FIG. 37 at 141, deposited on substrate 48. Deposit of single crystalline materials, forming layer 192, on the surface of mask 52 has occurred during epitaxial growth of laser structure 191. Upon completion of this growth, but prior to deposit of metalization 152 and contacts 132 and 136, an electrically insulating layer 194 is deposited over the entire exposed surface of the device 190, forming deposited layers 194.1 and 194.2. Conventional metalization techniques can now be applied. The mask lips 58 with deposits will serve as a shadow mask and metalization vapors will not penetrate into the open regions of chamber 57.

One might suspect a serious drawback if insulating materials used in this growth process in system 10 might cause contamination, e.g., the subsequent deposition of oxides or nitrites after the deposition of III-V or II-VI elements or compounds. However, $Si_3N_4$ layers 194 have been successfuly grown after the deposition of the laser structure 191. $Si_3N_4$ is one of the easiest insulating compounds to grow in the MO-CVD system 10 at this point since their gas mixtures (5% $SiH_4$ in $H_2$ and $NH_3$) are believed to be the least effected by the background impurities already present in the reactor 18. It is believed that this can be extended to other insulating layers, such as, $Al_2O_3$, $SiO_2$ and SiC.

Next, by employing an optical microscope, projection mask aligner or electron lithography, determination can be readily made of the center of laser structure 191 because of the interference fringes created by the microscope light reflecting from the surface of insulating layer portion 194.1. These fringes result from the variation in the thickness of layer 194, the color pattern at center point being quite distinguishable. For example, in the case of layer portion 294.1 comprised of $Si_3N_4$, the interference pattern could be a deep rich blue color at the center point and vary to lighter blues and other lighter colors away from the center point. This method of alignment permits the formation of the stripe 198 in the layer portion 194.1 by photolithographic and plasma etch techniques. After the formation of stripe 198, the metalization 152 may be vapor etch techniques. After the formation of stripe 198, the metalization 152 may be vapor deposited. Thus, a very confined current channel can be fabricated to confine the current flow 200 to a small region of the active layer 293 of structure 191 thereby lowering the current threshold of the device 190.

The same process can be employed to determine the center point of an applied photo resist layer. For example, top layer 194.1 may be a spun photo resist layer. However, because of the manner of its application to structure 191 having spatial variation, i.e., curved contour, the photo resist layer will be thinner at the top of this structure as compared to adjacent regions. This process for determining the center point may be used whether this position is of minimum or maximum cross-sectional thickness, and regardless of the particular material used for the top layer.

The beam of confined radiation may be polychromatic, monochromatic or very narrow bandwidth or of single wavelength. Examples are mercury vapor lamps or a laser beam. Of special interest is a laser beam tunable to a wavelength within a particular bandwidth or a discharge lamp having certain spectral lines which can selectively be filtered.

By projecting the confined radiation onto the surface of the top layer 194.1 a pattern of interference fringes is produced, from which a determination of the center point of the layer can be made distinguishing the center point position by definitive resolution of intensity or color variations created at this position due to the produced fringes.

FIG. 41 illustrates the employment of this alignment and current confinement technique relative to removable mask embodiments. The laser structure 214 having active layer or region 216 is grown, employing, for example, a mask 97 shown in FIG. 19 or a mask 104 in FIG. 24, on substrate 70. With the removable mask still in place, the electrically insulating layer 218 (such as, $Si_3N_4$) is grown.

The mask is then removed from the reactor 18 and an additional electrically insulating layer 220 is deposited on the device. Since the mask has been removed, layer 122 will cover the entire surface of the structure.

The device 210 is then removed from the reactor 18 and using the alignment technique just described and conventional photolithographic and plasma etch techniques, the stripe 222 can be found at the exact center point of laser structure 214.

While the invention has been described in conjunction with specific embodiments, it is evident that many alternatives, modifications and variations will be apparent to those skilled in the art in light of the foregoing description. Accordingly, it is intended to embrace all such alternatives, modifications, and variations as fall within the spirit and scope of the appended claims. An alternative example of a mask structure is the provision of a cavity or channel extending from one end to the other in a surface of a flat mask structure. This nonplanar surface of the mask is laid face down on the substrate so that an end face of the cavity is exposed, as positioned on the substrate. This end face of the cavity forms an aperture to the extent that reactant gases can penetrate into space formed by the end face. A tapered structure can be formed on the substrate surface, such as, for example, a tapered optical coupler.

What is claimed is:

1. In a semiconductor device comprising a plurality of contiguous layers of semiconductor materials deposited on a semiconductor structure, masking means provided during the deposition of at least one of said layers by means of pyrolyzation of vapor mixtures of said semiconductor materials through an aperture in said mask, said at least one of said layers characterized by having a predetermined lateral spatial thickness variation, said lateral spatial thickness variation predetermined in part by the dimensional size and thickness of said mask aperture, the thickest region of said lateral spatial thickness variation being central of said mask aperture.

2. In the semiconductor device according to claim 1 wherein said mask forms a integral part of said device.

3. In the semiconductor device according to claim 1 wherein said mask is one of said semiconductor layers in said device.

4. In the semiconductor device according to claim 2 wherein said semiconductor structure is said semiconductor substrate, said mask is an integral part of the upper surface of said substrate.

5. In the semiconductor device according to claim 2 wherein said plurality of contiguous layers of semiconductor materials deposited on a substrate form a semiconductor injection laser, one of said layers fabricated to form an active layer for optical wave generation and propagation under laser conditions, one of said layers of semiconductor materials having an elongated aperture therein constituting a mask, a chamber formed beneath said aperture, several of said layers including said active layer deposited through said aperture onto said substrate, at least one of said deposited layers characterized by lateral spatial variation in thickness.

6. In the semiconductor device according to claim 5 wherein said at least one layer is said active layer.

7. In the semiconductor injection laser of claim 5 including an electrically insulating layer deposited on said several layers, current confinement means formed in said insulating layer.

8. In a semiconductor injection laser comprising a plurality of contiguous layers of semiconductor materials deposited on a substrate, one of said layers forming an active layer for optical wave generation and propagation under lasing conditions, another layer of a semiconductor material formed on said substrate and having an elongated aperture therein constituting a mask, a chamber formed beneath said aperture, several of said contiguous layers including said active layer deposited through said aperture onto the surface of said substrate and providing a lateral spatial thickness variation in said layers, the lateral thickness variation of said several deposited layers determined in part by the dimensional size and thickness of said mask aperture and the volume and lateral extent of said chamber.

9. In the semiconductor injection laser of claim 8 wherein said mask layer comprises a single crystalline material.

10. In the semiconductor injection laser of claim 8 wherein said mask layer comprises an amphorous material.

11. In the semiconductor injection laser of claim 8 including an electrically insulating layer deposited on said several layers, current confinement means formed in said insulating layer.

12. In the semiconductor laser of claim 11 wherein at least one mesa is formed on said substrate surface.

13. In the semiconductor laser of claim 11 wherein at least one channel is formed on said substrate surface.

14. In a semiconductor laser, a semiconductor structure including at least one integral layer thereon, an elongated aperture formed in said layer, a chamber found beneath said aperture in said semiconductor structure, said chamber extending beneath said layer forming a perimetrical lip about said layer aperture, a plurality of contiguous semiconductor layers deposited via chemical vapor deposition through said apertures into said chamber onto an exposed surface therein of said semiconductor structure, one of said deposited layers forming an active layer to provide optical wave generation and propagation under lasing conditions.

15. In the semiconductor laser of claim 14 wherein at least one mesa is formed on said exposed structure surface.

16. In the semiconductor laser of claim 14 wherein at least one channel is formed on said exposed structure surface.

17. In the semiconductor laser of claim 14 wherein current facilitating means is deposited on said contiguous semiconductor layers.

18. In the semiconductor laser of claim 15 wherein current confinement means is included in said current facilitating means.

19. In the semiconductor laser of claim 18 wherein said current facilitating means is an electrically insulating layer and said current confinement means is a metalization layer deposited in a channel formed through said insulating layer as well as deposited thereon.

20. In the semiconductor laser of claim 14, said deposited contiguous semiconductor layers characterized by lateral spatial variation in thickness with tapered contour and with the thickest region of said variation central of said layer aperture, said variation predetermined in part by the dimensional size and thickness of said layer aperture.

21. In the semiconductor laser of claim 14 wherein said semiconductor structure is a semiconductor substrate, said apertured layer is deposited on said substrate.

22. In a semiconductor laser, a semiconductor substrate, an elongated aperture formed in said substrate, a plurality of contiguous semiconductor layers deposited via chemical vapor deposition in said aperture onto the exposed surface of said substrate, one of said deposited layers forming an active layer to provide optical wave propagation under lasing conditions, said deposited contiguous semiconductor layers characterized by lateral spatial variation in thickness with tapered contour and with the thickest region of said variation central of said substrate aperture, said variation predetermined in part by the dimensional size and thickness of said aperture.

23. In the semiconductor laser of claim 22 wherein current facilitating means is deposited on said contiguous semiconductor layers.

24. In the semiconductor laser of claim 23 wherein current confinement means is included in said current facilitating means.

25. In a semiconductor laser, a plurality of contiguous semiconductor layers deposited on a semiconductor substrate, one of said deposited layers forming an active layer to provide optical wave generation and propagation under lasing conditions, mask means provided during the metalorganic chemical vapor deposition of said layers, said mask means including an aperture through which said layers are sequentially deposited, said layers characterized by lateral spatial variation in thickness with tapered contour and with the thickest region of said variation central of said mask means aperture, said variation predetermined in part by the dimensional size and thickness of said aperture.

26. In the semiconductor laser of claim 25 wherein said mask means is a removable mask introduced on the surface of said substrate during said layer deposition.

27. In the semiconductor laser of claim 24 wherein there is more than one aperture in said removable mask.

28. In the semiconductor laser of claim 26 wherein a cavity is provided in the underside of said mask means forming a chamber as positioned on said substrate having at least one inlet comprising said aperture.

29. In the semiconductor laser of claim 25 wherein said mask means is an integral structure of said laser.

30. In the semiconductor laser of claim 29 wherein there is more than one aperture in said integral structure.

31. In the semiconductor laser of claim 29 wherein said integral structure is formed in said substrate.

32. In the semiconductor laser of claim 29 wherein a cavity is provided in the underside of said integral structure forming a chamber therebeneath in conjunction with said substrate and having at least one inlet comprising said aperture.

33. In the semiconductor laser of claim 29 wherein said integral structure comprises at least one deposited layer on said substrate.

34. In the semiconductor laser of claim 33 wherein a cavity is provided in the underside of said integral structure forming a chamber therebeneath in conjunction with a channel formed in said substrate and having at least one inlet comprising said aperture.

35. In the semiconductor laser of claim 33 wherein a cavity is provided in the underside of said integral structure forming a chamber therebeneath in conjunction with the surface of said substrate and having at least one inlet comprising said aperture.

36. In the semiconductor laser of claim 25 wherein said aperture forms a perimetrical lip, the side surface of said lip being perpendicular to the elongated planar extent of said substrate.

37. In the semiconductor laser of claim 25 wherein said aperture forms a perimetrical lip, the side surface of said lip being transverse relative to the elongated planar extent of said substrate.

* * * * *